(12) United States Patent
Hairapetian et al.

(10) Patent No.: US 6,721,380 B2
(45) Date of Patent: Apr. 13, 2004

(54) FULLY DIFFERENTIAL CMOS PHASE-LOCKED LOOP

(75) Inventors: Armond Hairapetian, Glendale, CA (US); Jun Cao, Irvine, CA (US); Afshin Momtaz, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 111 days.

(21) Appl. No.: 09/919,636

(22) Filed: Jul. 31, 2001

(65) Prior Publication Data

US 2002/0018535 A1 Feb. 14, 2002

Related U.S. Application Data (63) Continuation-in-part of application No. 09/540,243, filed on Mar. 31, 2000, now Pat. No. 6,526,113.
(60) Provisional application No. 60/238,317, filed on Oct. 4, 2000, and provisional application No. 60/148,417, filed on Aug. 11, 1999.

(51) Int. Cl.[7] .............................. H03L 7/08; H03L 7/089
(52) U.S. Cl. ...................... 375/376; 375/374; 327/148; 327/157; 331/25
(58) Field of Search ........................... 375/374, 375, 375/376; 326/93, 97, 98; 327/147, 148, 151, 155, 156, 157, 160; 331/10, 12, 14, 17, 18, 25, 32, 36 R (56) References Cited

U.S. PATENT DOCUMENTS

| | | | |
|---|---|---|---|
| 4,030,045 A | | 6/1977 | Clark |
| 5,740,213 A | * | 4/1998 | Dreyer .................... 375/374 |
| 5,831,484 A | | 11/1998 | Lukes et al. |
| 6,011,822 A | | 1/2000 | Dreyer |
| 6,218,892 B1 | * | 4/2001 | Soumyanath et al. ........ 327/537 |
| 6,292,061 B1 | * | 9/2001 | Qu .......................... 331/17 |
| 6,369,626 B1 | * | 4/2002 | Donnelly et al. ........... 327/157 |

* cited by examiner

Primary Examiner—Young T. Tse
(74) Attorney, Agent, or Firm—Christie, Parker & Hale, LLP (57) ABSTRACT

The present invention relates in general to integrated circuits, and in particular to method and circuitry for implementing an improved phase-locked loop (PLL) in complementary metal-oxide-semiconductor (CMOS) technology using current-controlled CMOS ($C^3MOS$) logic. In an exemplary embodiment, a phase-locked loop includes a phase-frequency detector, a Gm cell block, a low pass filter and a voltage controlled oscillator. These various elements of the phase-locked loop are connected to one another in a fully differential manner, i.e., each element has an input and/or an output each having at least a differential signal. In one embodiment, each of these various elements of the phase-locked loop is implemented using $C^3MOS$ logic.

26 Claims, 5 Drawing Sheets

FULLY DIFFERENTIAL CMOS PHASE-LOCKED LOOP

CROSS-REFERENCES TO RELATED APPLICATION(S)

This is a continuation-in-part application from co-pending, commonly assigned U.S. patent application Ser. No. 09/540,243, filed on Mar. 31, 2000, entitled "Gm cell based Phase Locked Loops," by Gutierrez et al., now U.S. Pat. No. 6,526,113 B1, which claims the benefit of priority under 35 U.S.C. § 119 from commonly assigned U.S. Provisional Patent Application Serial No. 60/148,417, filed on Aug. 11, 1999, both disclosures are hereby incorporated by reference in its entirety for all purposes.

This continuation-in-part application also claims the benefit of priority under 35 U.S.C. § 119 from co-pending, commonly assigned U.S. Provisional Patent Application Serial No. 60/238,317 filed on Oct. 4, 2000, the disclosure of which is hereby incorporated by reference in its entirety for all purposes.

BACKGROUND OF THE INVENTION

The present invention relates in general to integrated circuits, and in particular to method and circuitry for implementing an improved phase-locked loop (PLL) in complementary metal-oxide-semiconductor (CMOS) technology.

The convergence of various high speed data communication technologies (e.g., Ethernet, fiber channel, IEEE firewire links) into the gigabit domain has focused the efforts of integrated circuit designers on developing high speed circuit techniques for processing broadband signals. Similarly, efforts directed at developing low cost and low power dissipation circuits have been driven by the explosive growth in wireless media for voice and data communications.

A circuit block that is commonly found in voice and data communication applications is a phase-locked loop (PLL). The primary function of the PLL is to maintain a fixed phase relationship between an input (e.g., clock) signal and a reference signal. A PLL designed for a digital application typically includes a phase and/or frequency detector, a charge pump, a loop filter, a voltage controlled oscillator (VCO), and an (optional) divider. The phase detector determines the phase differences between an input signal (i.e., an input data stream or an input clock) and a reference signal derived from the VCO, and generates a detector output signal indicative of the detected phase differences. The charge pump receives the detector output signal and generates a set of phase error signals (e.g., UP and DOWN currents fed into the filter). The loop filter filters the phase error signals to generate a control signal that is then used to adjust the frequency of the VCO such that the phases of the two signals provided to the phase detector are locked. When the phases of the two signals are locked, the respective frequencies of the two signals are exactly the same.

Figure 1:
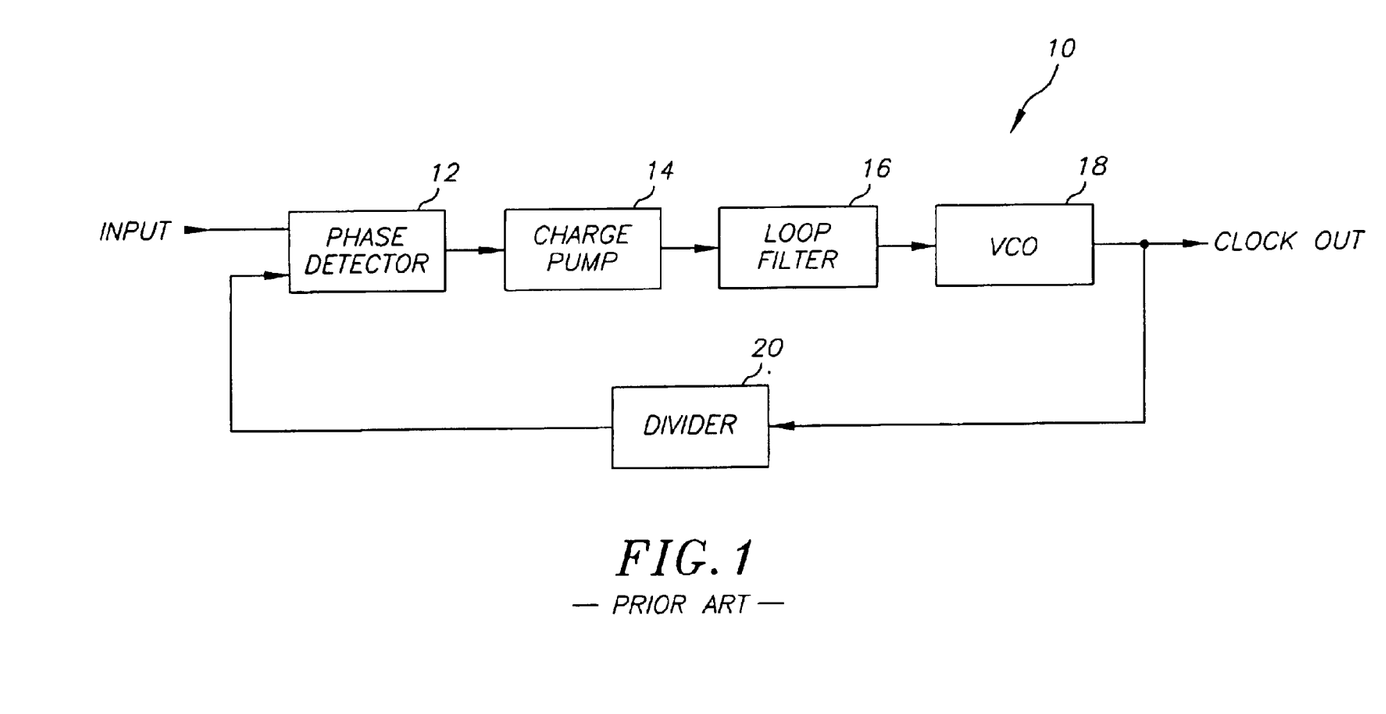
FIG. 1 is a simplified schematic block diagram of a conventional phase locked loop.

FIG. 1 is a simplified block diagram of a conventional phase locked loop 10. An input signal is provided to a phase detector 12 that also receives a reference signal from a divider 20. The input signal can be a clock signal, a data stream, or some other types of signal having phase and/or frequency information to which the phase locked loop can be locked. The reference signal is typically a clock signal used to trigger the phase detector 12. Phase detector 12 generates an output signal indicative of the timing differences (i.e., the phase differences) between the input signal and the reference signal. The output signal from the phase detector 12 is provided to a charge pump 14 that generates an output signal indicative of the detected phase error between the input and reference signals. In some designs, the charge pump output signal is logic high if the phase of the input signal is early (or late) relative to that of the reference signal, logic low if the phase of the input signal is late (or early) relative to that of the reference signal, and tri-stated for a period of time between clock edges.

The charge pump output signal is provided to a loop filter 16 that filters the signal with a particular transfer characteristic to generate a control signal. The control signal is then provided to, and used to control the frequency of, a voltage-controlled oscillator (VCO) 18. VCO 18 generates an output clock having a frequency can be adjusted by the control signal at the input of VCO. The output clock is provided to divider 20 that divides the frequency of the output clock by a factor of N to generate the reference signal. Divider 20 is optional and not used when the frequency of the output clock is the same as that of the input signal (i.e., N=1). The control signal adjusts the frequency of VCO 18 such that the frequencies of the two signals provided to phase detector 12 are locked when the phase locked loop 10 is locked.

In typical PLLs, signals are transmitted between components in a non-differential manner. Signals transmitted in this manner, however, are subject to a number of shortcomings. For example, noise from power supply fluctuations and substrate can relatively easily affect the quality of such signals causing jitters and other problems. Hence, it would be desirable to implement the PLL in a fully differential architecture that would significantly reduce jitter and improve overall noise performance.

Furthermore, modern day devices and applications continually demand improved performance criteria including high speed, low power dissipation, and low cost, from their constituent components. To realize and meet such performance criteria, it would be desirable to implement the PLL in low-cost CMOS technology that allows for increased levels of integration.

SUMMARY OF THE INVENTION

The present invention relates specifically to a fully differential phase-locked loop. In one embodiment, the phase-locked loop includes a phase-frequency detector, a Gm cell block, a low pass filter and a voltage controlled oscillator. These various elements of the phase-locked loop are connected to one another in a fully differential manner, i.e., each element has an input and/or an output each having at least a differential signal. In one embodiment, each of these various elements of the phase-locked loop is implemented using high speed current-controlled complementary metal-oxide-semiconductor ($C^3MOS$) logic.

Accordingly, in an exemplary embodiment, an improved phase-locked loop is provided including: a detector configured to receive an input signal and a reference signal and to provide a detector output signal indicative of a difference between the input signal and the reference signal; a signal filter coupled to the detector and configured to receive the detector output signal and to provide a control signal; and a voltage controller oscillator coupled to the signal filter and configured to receive the control signal and to provide an oscillator signal which is adjustable based on the control signal, the oscillator signal is fed back to the detector as the reference signal; wherein the detector, the signal filter, and the voltage controller oscillator are connected to one another in a fully differential manner.

Optionally, a transconductance (or Gm) cell circuit is disposed between the detector and the signal filter and configured to provide a current output signal to the signal filter; and a divider circuit is disposed between the voltage controlled oscillator and the detector and configured to provide a divided version of the oscillator signal to the detector.

Accordingly, in another exemplary embodiment, a method for implementing a phase-locked loop having a plurality of components including a detector, a transconductance (or Gm) cell, a signal filter, a voltage controlled oscillator and a divider circuit is provided, comprising: connecting each of the plurality of components to one another in a differential manner; and implementing each of the plurality of components using C³MOS logic.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

DESCRIPTION OF THE SPECIFIC EMBODIMENTS

Figure 2:
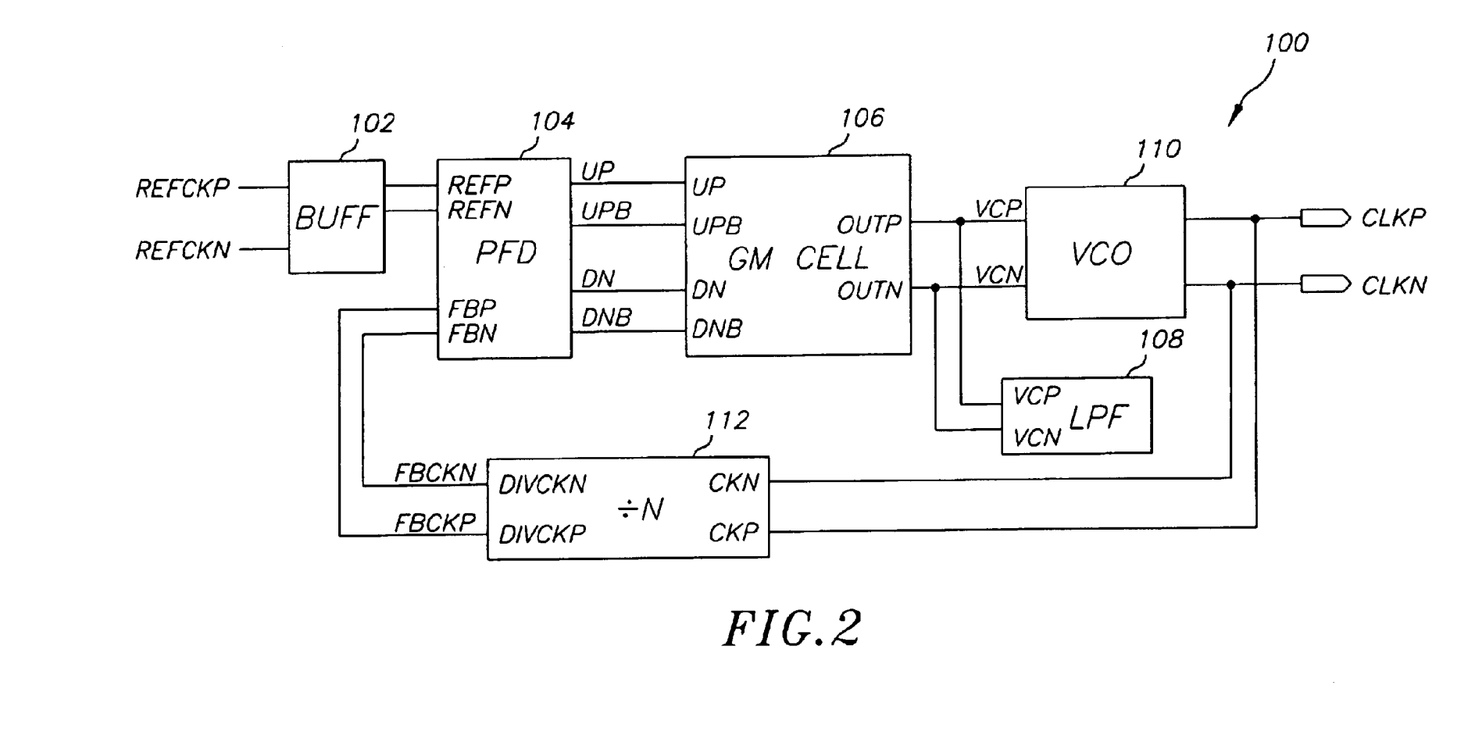
FIG. 2 is a simplified schematic block diagram of a phase locked loop according to one exemplary embodiment of the present invention.

The present invention will now be described. Referring to FIG. 2, there is shown a simplified schematic block diagram of a PLL 100 according to one exemplary embodiment of the present invention. According to this exemplary embodiment, PLL 100 is fully differential and is implemented in standard CMOS processing technology using current-controlled CMOS (or C³MOS) logic. Using C³MOS logic allows for higher degree of integration which, in turn, leads to high speed signal processing and lower cost.

Various embodiments for circuitry implemented using C³MOS logic are described in detail in commonly-assigned U.S. patent application Ser. No. 09/484,856, entitled "Current-Controlled CMOS Logic Family," to A. Hairapetian, filed on Jan. 18, 2000, now U.S. Pat. No. 6,424,194 B1, which is hereby incorporated by reference for all purposes. As described therein, the basic building block of the C³MOS logic family uses a pair of conventional MOSFETs that steer current between a pair of load devices in response to a difference between a pair of input signals. Thus, unlike conventional CMOS logic, C³MOS logic dissipates static current and is able to operate at much higher speeds.

The C3MOS logic family contains all the building blocks of other logic families. Examples of such building blocks include inverters, buffers, level shift buffers, N-input NOR and NAND gates, exclusive OR (XOR) gates, flip flops and latches, and the like. More complex logic circuits such as shift registers, counters, frequency dividers, etc., can be constructed in C3MOS using the basic logic elements. Based on the disclosure and teaching provided in U.S. patent application Ser. No. 09/484,856, now U.S. Pat. No. 6,424, 194 B1, as identified above, it should be apparent to a person of ordinary skill in the art to be able to use C³MOS logic to design complex logic circuits.

As shown in FIG. 2, in an exemplary embodiment, the PLL 100 includes a differential input buffer BUFF 102, a differential phase-frequency detector PFD 104, a Gm cell block 106, a low pass filter 108, a voltage controller oscillator VCO 110 and a divider 112. As will be further described below, these various elements of the PLL 100 are connected to one another in a fully differential manner. In other words, each of the elements of the PLL 100 has at least a differential input comprising two constituent input signals and a differential output comprising two constituent output signals. It should be understood that a differential signal inherently includes two constituent signals.

The PLL 100 receives a differential input signal, including two input clock signals REFCKP and REFCKN, at the differential input buffer 102. The differential input buffer 102 amplifies and conditions the two input clock signals REFCKP and REFCKN while maintaining their differential nature. The differential input buffer 102 is preferably implemented in C³MOS logic. By implementing the differential input buffer 102 in C³MOS, good common mode rejection and high slew rate can be achieved. The use of buffer 102, however, is optional.

The differential phase-frequency detector 104 then receives the differential input signal as well as a differential reference signal, including signals FBCKN and FBCKP, from the differential input buffer 102 and the divider 112 respectively. The phase-frequency detector 104 detects the difference, if any, in the phase/frequency of the differential input clock signal and the differential reference signal and accordingly generates two differential detector output signals comprising two pairs of output signals in the form of complementary UP or DN signals. It should be noted that each of the complementary UP and DN differential signals is made up of a pair of signals UP/UPB and DN/DNB respectively.

Figure 3:
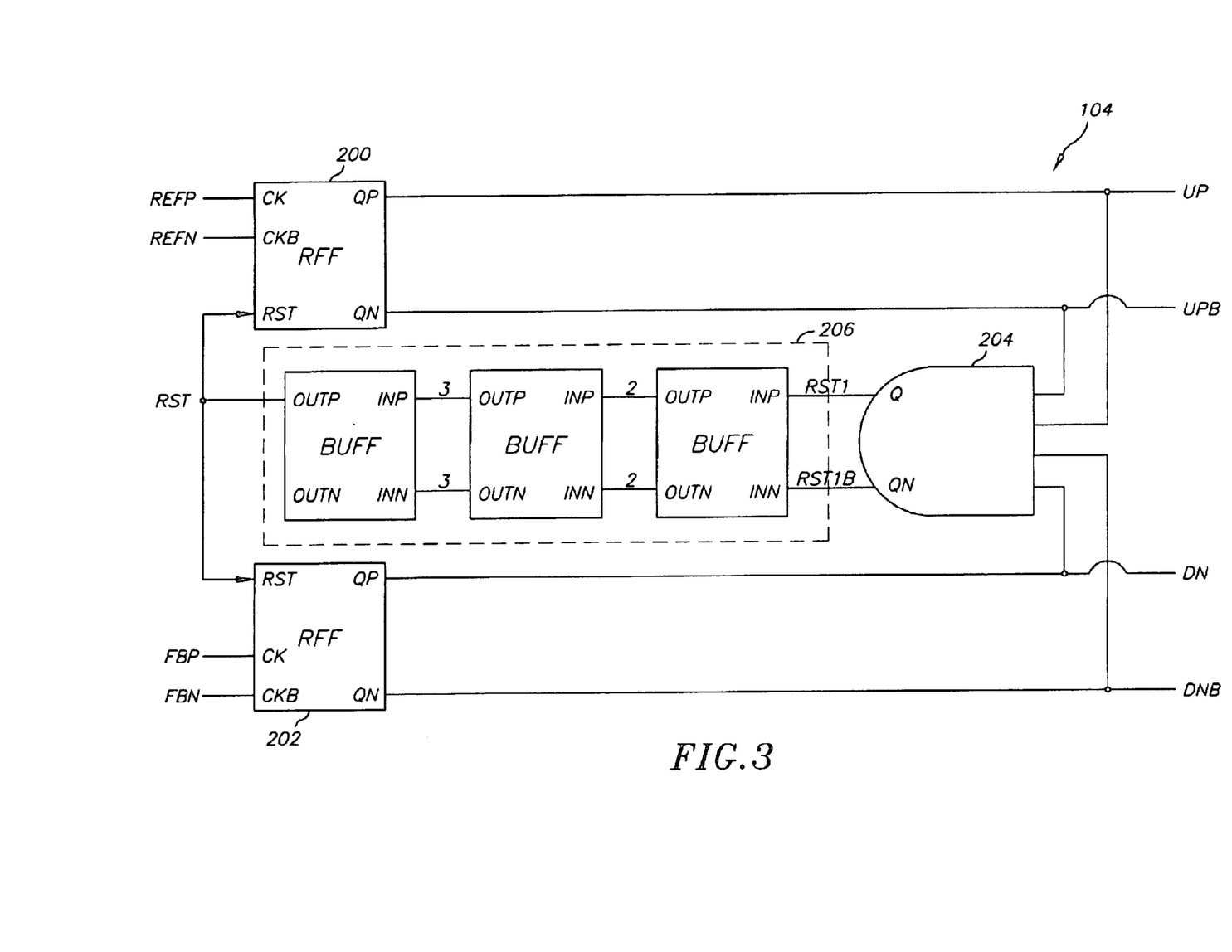
FIG. 3 is a simplified schematic block diagram of a differential phase-frequency detector according to one exemplary embodiment of the present invention.

FIG. 3 shows an exemplary implementation for the differential phase-frequency detector 104. In this exemplary implementation, the differential phase-frequency detector 104 includes a pair of resetable flip-flops RFF 200 and 202, a chain of buffers 206 and an AND logic function implemented in the form of an AND gate 204. Preferably, these various circuit elements in the differential phase-frequency detector 104 are implemented using C³MOS logic.

Resetable flip-flops 200 and 202 receive differential signals at REFP/REFN and FBP/FBN inputs from the differential input buffer 102 and the divider 112, respectively. AND gate 204 then logically combines the four outputs UP/UPB and DN/DNB from the two resetable flip-flops 200 and 202 to generate the reset signal RST which is eventually fed back to the two flip-flops 200 and 202. The chain of buffers 206 add a pre-determined amount of delay before the reset signal RST is applied to the flip-flops 200 and 202 to avoid a too narrow reset signal RST.

Referring back to FIG. 2, the differential detector output signals from the phase-frequency detector 104 are then fed to the Gm cell block 106. The Gm cell block 106 operates to convert a voltage input signal to a current output signal which is indicative of the detected phase/frequency error, if any, between the two differential signals received by the differential phase-frequency detector 104. A pre-filter may be optionally included between the outputs of the phase-frequency detector 104 and the inputs of the Gm cell 106 to adjust signal levels for C³MOS logic levels, if desired.

Figure 4:
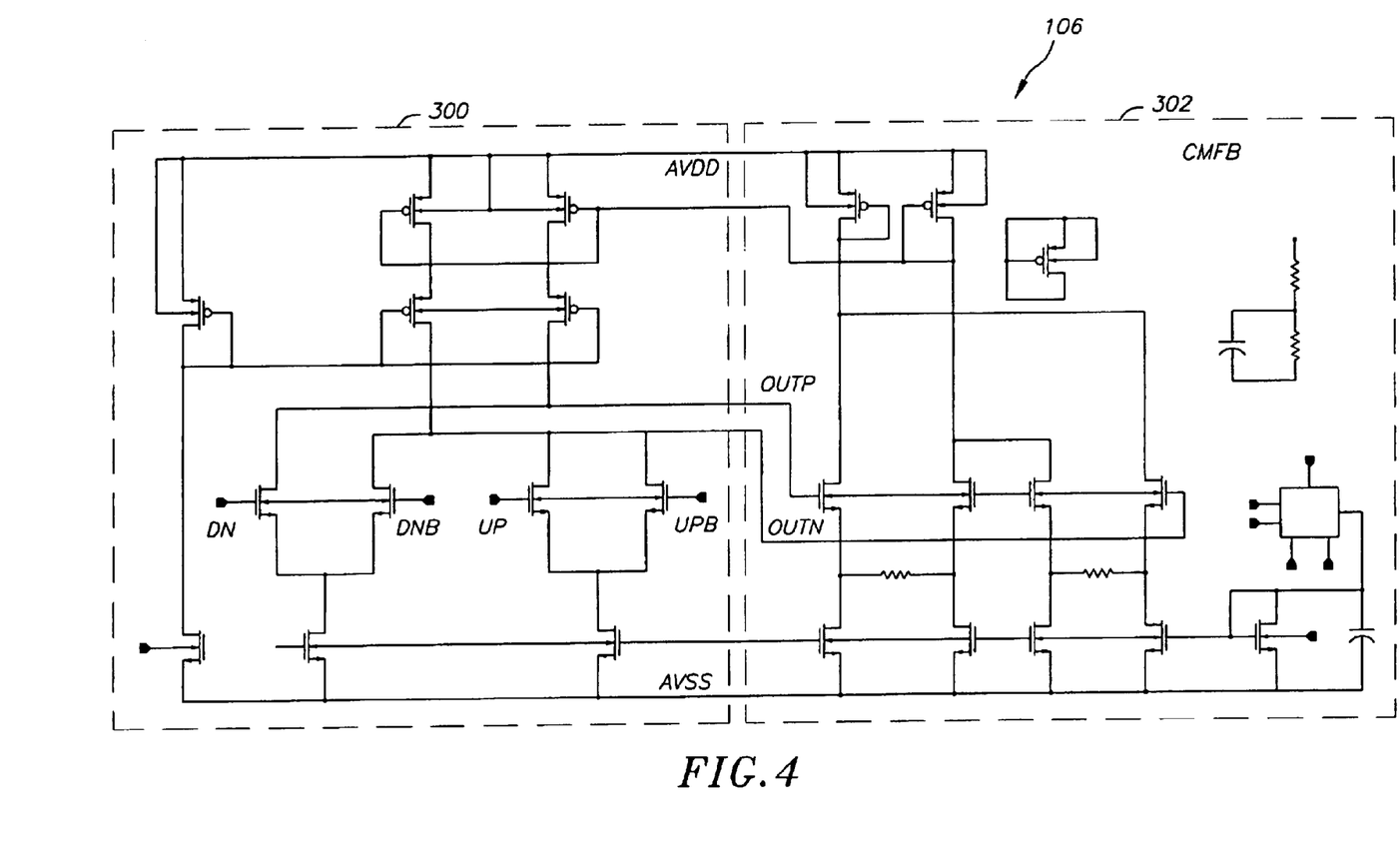
FIG. 4 is a simplified circuit diagram of a differential Gm cell block according to one exemplary embodiment of the present invention.

FIG. 4 is an exemplary circuit implementation for a fully differential Gm cell block 106. Under this exemplary implementation, the Gm cell block 106 includes an amplifier stage 300 made up of a pair of differential inputs that receives signals DN/DNB and UP/UPB from the differential phase-frequency detector 104, and current source and load devices. More specifically, the amplifier stage 300 is connected to a common-mode feedback (CMFB) circuit 302. Preferably, the Gm cell block 106 is fully differential and is implemented using C³MOS technology. Detailed description of one embodiment of a Gm cell block 106 for use in the PLL 100 of the present invention is provided in commonly assigned U.S. patent application Ser. No. 09/540,243, entitled "Gm cell based Phase Locked Loops," by Gutierrez et al., filed on Mar. 31, 2000, now U.S. Pat. No. 6,526,113 B1, which is hereby incorporated in its entirety.

Referring back to FIG. 2, the Gm cell block 106 combines with the low pass filter LPF 108 to form an ideal integrator. The low pass filter 108 is a differential filter made of, for example, an RC network that can be either integrated with the rest of the circuitry or placed off chip. Since the output of the Gm cell block 106 is a differential current signal, feeding the output of the Gm cell block 106 to the low pass filter 108 causes voltage potential to develop at signals VCP and VCN which represent a differential voltage signal.

The differential voltage signal, represented by VCP and VCN, at the output of the Gm cell block 106 are then applied to the differential voltage controlled oscillator 110 to control the frequency of a differential oscillator output which is comprised of signals CLKP and CLKN. When the PLL 100 is locked, the voltage controlled oscillator 110 generates a differential oscillator output having a frequency that is locked to that of the differential input signal, REFCKP and REFCKN.

Figure 5:
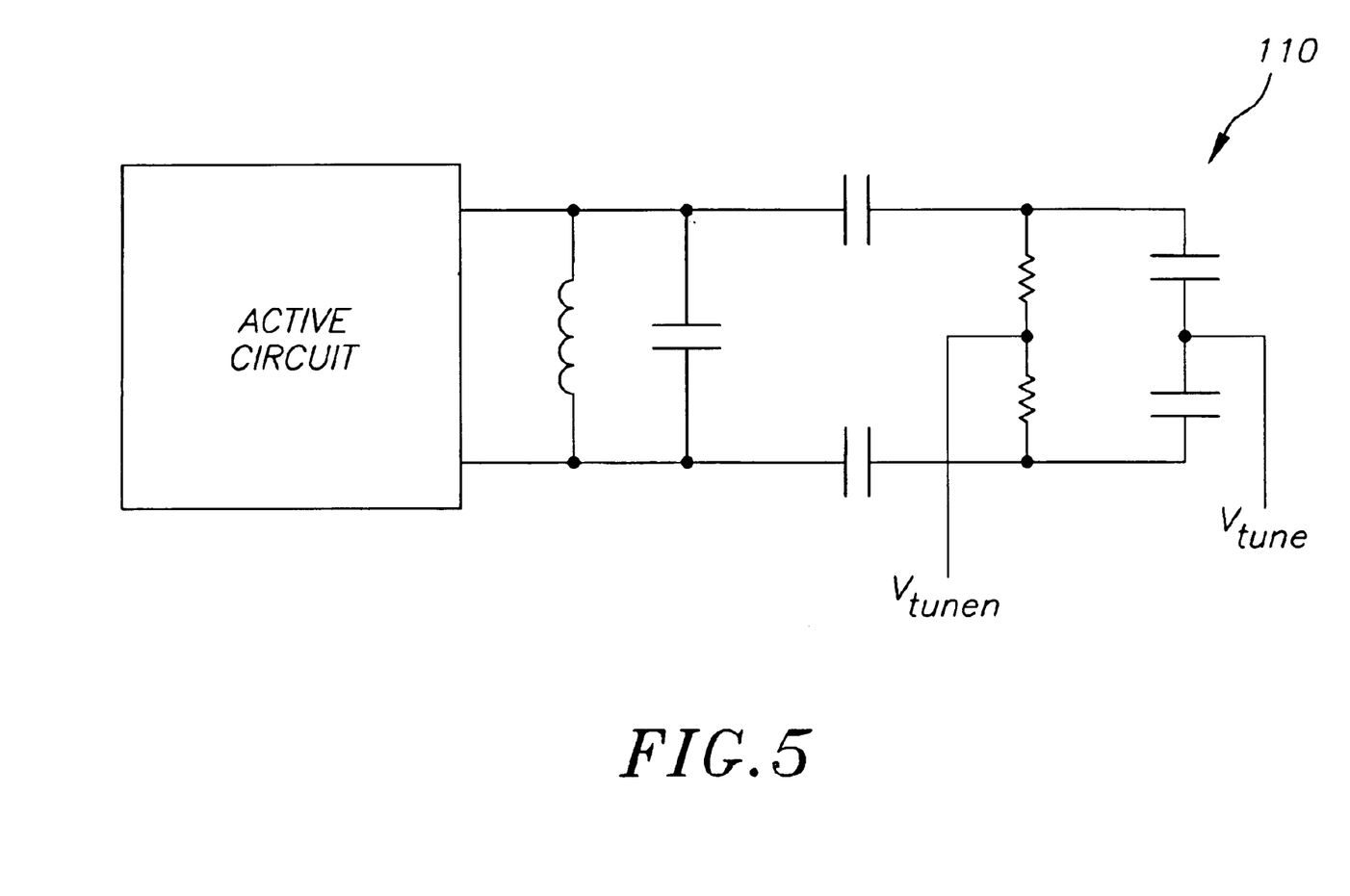
FIG. 5 is a simplified schematic block diagram of a differential voltage controlled oscillator according to one exemplary embodiment of the present invention.

FIG. 5 is a simplified schematic block diagram showing an exemplary implementation of the fully differential voltage controlled oscillator 110. As shown in FIG. 5, the voltage controlled oscillator 110 is implemented in the form of a differentially tuned varactor-inductor oscillator. Such an exemplary oscillator is described in greater detail in commonly assigned U.S. patent application Ser. No. 09/792,684, filed on Feb. 24, 2001, entitled "Method and Circuitry for Implementing a Differentially Tuned Varactor-Inductor Oscillator," to Gutierrez, which is hereby incorporated by reference in its entirety.

The differential oscillator output of the voltage controlled oscillator 110 is then fed to divider 112, if necessary. Since the voltage controlled oscillator 110 usually operates at a high frequency, e.g., 32 times the input signal frequency, the frequency of the differential oscillator output may need to be reduced before it is provided to the phase-frequency detector 104. The divider 112 is used for this frequency-reduction purpose.

The divider or divide by N (÷N) circuit 112 receives the differential oscillator output of the voltage controlled oscillator 110. The divider 112 then divides the signal frequency down to the input frequency (e.g., ÷32), generating signals FBCKN and FBCKP, which represent a divided version of the differential oscillator output, which are fed back to the phase-frequency detector 104. Preferably, the divider 112 is also implemented using differential C³MOS logic.

As thus constructed, a fully differential PLL using C³MOS logic exhibits a number of performance advantages over prior art PLLs including higher speed, reduced noise and ease of integration.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A differential phase-locked loop comprising:
   a differential detector configured to receive a pair of input signals and a pair of reference signals and to provide a pair of detector output signals indicative of a difference between the pair of input signals and the pair of reference signals;
   a differential signal filter coupled to the detector and configured to receive the pair of detector output signals and to provide a pair of control signals; and
   a differential voltage controlled oscillator coupled to the signal filter and configured to receive the pair of control signals and to provide a pair of oscillator signals which is adjustable based on the pair of control signals, the pair of oscillator signals is fed back to the detector as the pair of input signals;
   wherein the differential detector, the differential signal filter, and the differential voltage controlled oscillator are connected to one another in a fully differential manner.

2. The differential phase-locked loop of claim 1 wherein the differential detector, the differential signal filter, and the differential voltage controlled oscillator are each implemented using C³MOS logic.

3. The differential phase-locked loop of claim 2 further comprising:
   a differential Gm cell circuit disposed between the differential detector and the differential signal filter and configured to receive the pair of detector output signals and to provide a pair of current output signals;
   wherein the pair of current output signals is fed to the differential signal filter;
   wherein the differential Gm cell circuit is coupled to the differential detector and the differential signal filter in a fully differential manner; and
   wherein the differential Gm cell circuit is implemented using C³MOS logic.

4. The differential phase-locked loop of claim 3 wherein the pair of input signals, the pair of reference signals, the pair of detector output signals, the pair of current output signals, the pair of control signals and the pair of oscillator signals are implemented in a differential manner.

5. The differential phase-locked loop of claim 2 further comprising:
   a differential divider circuit disposed between the differential voltage controlled oscillator and the differential detector;
   wherein the differential divider circuit is coupled to the differential voltage controlled oscillator and the differential detector in a fully differential manner; and
   wherein the differential divider circuit is implemented using C³MOS logic.

6. The differential phase-locked loop of claim 1 wherein the differential detector is a differential phase-frequency detector.

7. The differential phase-locked loop of claim 1 wherein the differential signal filter is a differential lowpass filter.

8. The differential phase-locked loop of claim 1 wherein the differential detector includes:
   first and second resetable flip-flops configured to receive a first differential signal and a second differential signal respectively;
   an AND logic function configured to receive differential outputs from the first and second resetable flip-flops; and
   one or more buffers configured to receive output from said AND logic function and to provide a reset signal to reset the first and second resetable flip-flops.

9. An integrated circuit comprising the differential phase-locked loop of claim 1.

10. A communication system comprising the differential phase-locked loop of claim 1.

11. A phase-locked loop comprising:
   a detector configured to receive a pair of differential input signals and a pair of differential reference signals and to provide a pair of differential detector output signals indicative of a difference between the pair of differential input signals and the pair of differential reference signals;
   a Gm cell circuit coupled to the detector and configured to receive the pair of differential detector output signals and to provide a pair of differential current output signals;
   a signal filter coupled to the Gm cell circuit and configured to receive the pair of differential current output signals and to provide a pair of differential control signals; and
   a voltage controlled oscillator coupled to the signal filter and configured to receive the pair of differential control signals and to provide a pair of differential oscillator signals which is adjustable based on the pair of differential control signals, the pair of differential oscillator signals is fed back to the detector as the pair of differential input signals;
   wherein the detector, the Gm cell circuit, the signal filter, and the voltage controlled oscillator are each implemented using CMOS logic.

12. The phase-locked loop of claim 11 further comprising:
   a divider circuit disposed between the voltage controlled oscillator and the detector;
   wherein the divider circuit is configured to receive the pair of differential oscillator signals and to provide a pair of differential divided signals to be fed to the detector as the pair of differential input signals; and
   wherein the divider circuit is implemented using $C^3MOS$ logic.

13. The phase-locked loop of claim 11 wherein the detector is a phase-frequency detector.

14. The phase-locked loop of claim 11 wherein the signal filter is a lowpass filter.

15. The phase-locked loop of claim 11 wherein the detector includes:
   first and second resetable flip-flops configured to receive a first differential signal and a second differential signal respectively;
   an AND logic function configured to receive differential outputs from the first and second resetable flip-flops; and
   one or more buffers configured to receive output from said AND logic function and to provide a reset signal to reset the first and second resetable flip-flops.

16. An integrated circuit comprising the phase-locked loop of claim 11.

17. A communication system comprising the phase-locked loop of claim 11.

18. A phase-locked loop comprising:
   a detector configured to receive a pair of input signals and a pair of reference signals and to provide a pair of detector output signals indicative of a difference between the pair of input signals and the pair of reference signals;
   a Gm cell circuit coupled to the detector and configured to receive the pair of detector output signals and to provide a pair of current output signals;
   a signal filter coupled to the Gm cell circuit and configured to receive the pair of current output signals and to provide a pair of control signals;
   a voltage controlled oscillator coupled to the signal filter and configured to receive the pair of control signals and to provide a pair of oscillator signals which is adjustable based on the pair of control signals; and
   a divider circuit coupled to the voltage controlled oscillator and configured to receive the pair of oscillator signals and to provide a divided version of the pair of oscillator signals to be fed to the detector as the pair of input signals;
   wherein the detector, the Gm cell circuit, the signal filter, the voltage controlled oscillator and the divider circuit are connected to one another in a fully differential manner; and
   wherein the detector, the Gm cell circuit, the signal filter, the voltage controlled oscillator and the divider circuit are implemented using $C^3MOS$ logic.

19. The phase-locked loop of claim 18 wherein the differential detector includes:
   first and second resetable flip-flops configured to receive a first differential signal and a second differential signal respectively;
   an AND logic function configured to receive differential outputs from the first and second resetable flip-flops; and
   at least one buffer configured to receive differential output from the AND logic function and to provide a reset signal to reset the first and second resetable flip-flops.

20. A method for implementing a phase-locked loop, comprising:
   providing a pair of differential input signals and a pair of differential reference signals to a detector;
   providing a pair of differential detector output signals from the detector as input to a signal filter;
   providing a pair of differential control signals from the signal filter as input to a voltage controlled oscillator; and
   providing a pair of differential oscillator signals from the voltage controlled oscillator as the pair of differential input signals to the detector.

21. The method of claim 20 further comprising:
   implementing the detector, the signal filter and the voltage controlled oscillator using CMOS logic.

22. The method of claim 20 further comprising:
   disposing a Gm cell circuit between the detector and the signal filter;
   providing the pair of differential detector output signals from the detector as input to the Gm cell circuit; and
   providing a pair of differential current output signals from the Gm cell circuit as input to the signal filter.

23. The method of claim 22 further comprising:
implementing the Gm cell circuit using $C^3MOS$ logic.

24. The method of claim 20 further comprising:
disposing a divider circuit between the voltage controlled oscillator and the detector;
providing the pair of differential oscillator signals from the voltage controlled oscillator as input to the divider circuit; and
providing a divided version of the pair of differential oscillator signals from the divider circuit as the pair of differential input signals to the detector.

25. The method of claim 24 further comprising:
implementing the divider circuit using $C^3MOS$ logic.

26. A method for implementing a phase-locked loop, comprising:
providing a pair of differential input signals and a pair of differential reference signals to a detector;
providing a pair of differential detector output signals from the detector as input to a Gm cell circuit;
providing a pair of differential current output signals from the Gm cell circuit as input to a signal filter;
providing a pair of differential control signals from the signal filter as input to a voltage controlled oscillator;
providing a pair of differential oscillator signals from the voltage controlled oscillator as input to a divider circuit;
providing a divided version of the pair of differential oscillator signals from the divider circuit as the pair of differential input signals to the detector; and
implementing the detector, the Gm cell circuit, the signal filter, the voltage controlled oscillator and the divider circuit using $C^3MOS$ logic.

* * * * *